United States Patent [19]

Kelleher

[11] 4,064,407
[45] Dec. 20, 1977

[54] PULSE VOLTAGE REGULATOR

[75] Inventor: John J. Kelleher, Malden, Mass.

[73] Assignee: The United States of America as represented by the Secretary of the Army, Washington, D.C.

[21] Appl. No.: 752,593

[22] Filed: Dec. 20, 1976

[51] Int. Cl.² .............................................. H03K 5/08
[52] U.S. Cl. ................................... 307/268; 307/237; 307/246; 328/67; 328/171
[58] Field of Search ............... 307/237, 268, 318, 246, 307/297; 320/1; 328/169, 171, 165, 67; 323/17

[56] References Cited

U.S. PATENT DOCUMENTS

| 3,196,289 | 7/1965 | Heizer | 307/237 |
| 3,393,368 | 7/1968 | Coyle | 328/67 X |
| 3,675,116 | 7/1972 | Israel | 328/67 X |
| 3,840,774 | 10/1974 | Iwata | 315/39.51 |

Primary Examiner—John Zazworsky
Attorney, Agent, or Firm—Nathan Edelberg; Robert P. Gibson; Freddie M. Bush

[57] ABSTRACT

A pulse voltage regulator for maintaining constant output voltage pulses across a burst of high voltage low ripple input pulses by removing exactly the same amount of ripple energy from a clamp capacitor during the interpulse period as was added to the capacitor during a pulse period.

6 Claims, 2 Drawing Figures

PULSE VOLTAGE REGULATOR

DEDICATORY CLAUSE

The invention described herein was made in the course of or under a contract or subcontract thereunder with the Government and may be manufactured, used, and licensed by or for the Government for governmental purposes without the payment to me of any royalties thereon.

SUMMARY OF THE INVENTION

A pulse voltage regulator maintains a constant output voltage across a burst of high voltage, low ripple, input pulses. The high voltage input pulses are transformer coupled to a load circuit. A clamp capacitor connected across the secondary of the transformer suppresses the ripple voltage present on each high voltage pulse. The same amount of energy which is coupled into the clamp capacitor during the pulsing period is removed from the clamping capacitor during the interpulse period without adversely affecting the pulse to the load.

DESCRIPTION OF THE PREFERRED EMBODIMENT

When a high voltage pulse is transformer coupled to its load, ripple voltage of an unacceptable magnitude may be present on top of the pulse. The most convenient method of supressing the ripple is to shunt the ripple energy through a diode to a precharged capacitor connected in parallel with the load. However, the ripple energy shunted into the capacitor causes the capacitor voltage to increase with each pulse. Over a burst of pulses the voltage increase can become prohibitive since a capacitor of sufficient size to control the sequential voltage increase over the entire burst may be physically too large for the system. If a high voltage zener diode is placed in parallel with the capacitor, the voltage may still increase 10 to 30 percent before the zener current and the ripple energy input reach equilibrium. However by removing the same amount of energy from the clamp capacitor of the circuit during the interpulse period as was added to the capacitor during the pulse period the capacitor size may be kept within system requirements without adversely affecting the pulse coupled to the load.

Figure 1:
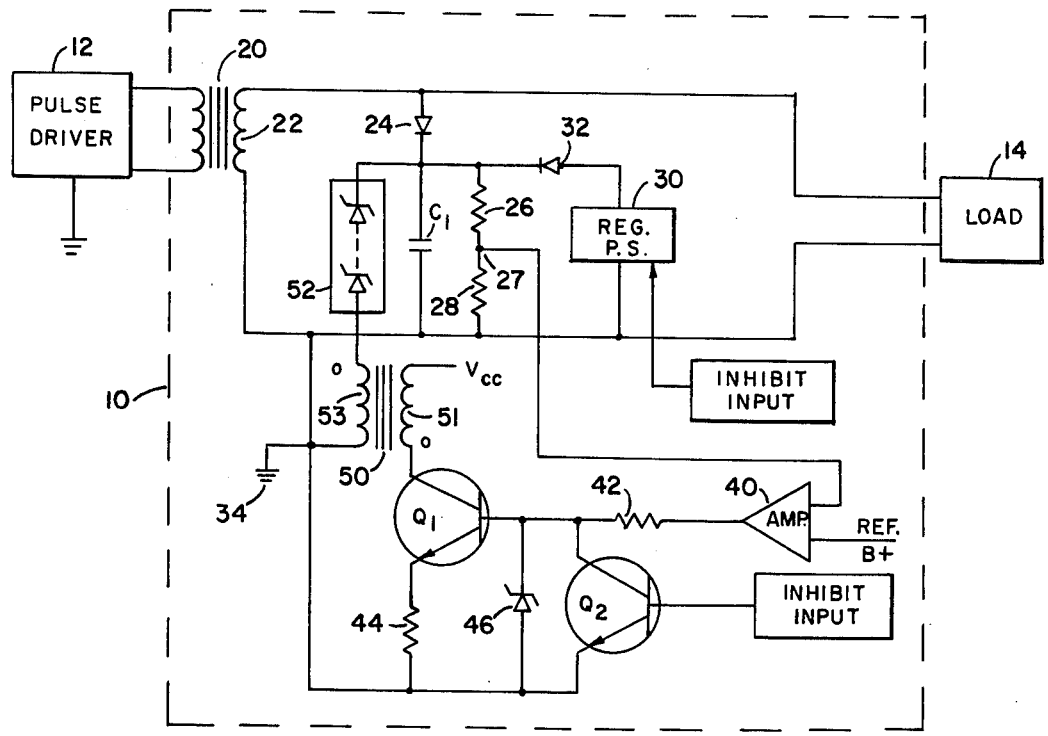
FIG. 1 is a partial schematic, partial block diagram of a preferred embodiment of the pulse voltage regulator.

Referring now to the drawings wherein FIG. 1 discloses a preferred embodiment of the system, a pulse voltage regulator 10 is coupled between a pulse generator or pulse driver 12 and a load circuit 14. Output pulses from pulse driver 12 are coupled to the primary winding of a transformer 20 of the pulse voltage regulator. The secondary winding 22 of transformer 20 is coupled across load 14 for supplying voltage pulses thereto. A capacitor or capacitor bank $C_1$ is coupled in series through a clamping diode 24 across the secondary winding 22, the anode of diode 24 being coupled to the transformer secondary winding. A series resistance network represented by resistors 26 and 28 is coupled in parallel with capacitor $C_1$ providing a high resistance voltage divider network for monitoring the voltage level across $C_1$ while allowing only a minimum of current drainage therethrough. A regulated power supply 30 is coupled in the forward direction through a diode 32 in parallel with capacitor $C_1$ for placing the initial charge on capacitor $C_1$. One side of the transformer secondary, capacitor $C_1$, resistor 28, and the regulated power supply 30 is coupled in common to a system ground 34. An amplifier 40 such as a differential amplifier has one input coupled to a junction 27 between resistors 26 and 28 for providing a voltage input to amplifier 40 which is indicative of the actual voltage charge across capacitor $C_1$. The other input to amplifier 40 is a reference input which is a voltage level input indicative of the preselected, desired voltage level across capacitor $C_1$. As the sensing input from junction 27 fluctuates with the voltage level across $C_1$ the output of amplifier 40 varies between a negative output when the reference signal is greater than the sensing input signal to a positive output when the sensing input signal is greatest. A transistor $Q_1$ is base coupled through a resistance 42 to the output of amplifier 40 and is directly coupled to the collector of a transistor $Q_2$. The emitter of $Q_1$ is coupled through a load resistance 44 to the emitter of $Q_2$ and to the system ground. A zener diode 46 is coupled between the base-collector junction of transistors $Q_1$ and $Q_2$ to system ground for protecting the transistor circuit. The base of transistor $Q_2$ is disposed for receiving an inhibit input for controlling operation of transistors $Q_1$ and $Q_2$. A constant potential source $V_{cc}$ is coupled through a winding 51 of a transformer 50 to the collector of $Q_1$ for providing a constant voltage through the transformer winding when $Q_1$ is activated. A zener diode or zener diode bank 52 is coupled to the junction between capacitor $C_1$ and the cathode of diode 24 and to the secondary winding 53 of transformer 50. The other side of the secondary winding of transformer 50 is coupled to ground, thereby providing a discharge path for capacitor $C_1$ through the zener diode assembly 52 and transformer 50 to ground when zener diode 52 has broken down. Regulated power supply 30 may be controlled, switched on and off, by an inhibit input to the regulator.

Typically pulse driver 12 may be the main or output pulse driver of a high voltage power supply for generating high voltage pulses, on the order of 1 kv or more for pulsing radio frequency tubes such as a klystron. The inhibit inputs to regulated power supply 30 and transistor $Q_2$ may be any one of several types of conventional controlling input signals. For example, the inhibit input to the base of $Q_2$ may be coupled from a low voltage auxiliary winding of transformer 20 to activate $Q_2$ during the same time period that a pulse is being coupled to load 14. Similarly the inhibit input to regulator power supply 30 may be the output of a retriggerable monostable multivibrator having a delay time longer than the normal pulse burst time of the output signal coupled to load 14, with the trigger input of the monostable multivibrator being coupled from a low voltage auxiliary winding of transformer 20. For a most simple state of operation, the input to regulator power supply 30 may be simply a manually operated switch which activates power supply 30 and is turned off prior to pulsing transformer 20. Another means of providing an inhibit input to the base of $Q_2$ would be a very high resistance across secondary 22 of transformer 20 with a low voltage tap coupled to the base of $Q_2$.

During operation, capacitor $C_1$ is precharged to a desired load voltage level by power supply 30. High voltage power pulses of energy are then coupled from driver 12 through the regulator 10 to load circuit 14. The high voltage pulses, which inherently contain ripple voltage, drive the primary winding of transformer 20. The voltage level coupled to the load must be kept within acceptable limits of operation for the load circuit, which requires that ripple voltage in the output pulses coupled through transformer 20 must be of an acceptable level or be removed. Power supply 30 is turned off during the entire burst of output pulses. The high voltage zener diode 52 has a zener voltage greater than the required pulse output voltage, for example 20 percent greater.

When an output pulse is coupled through transformer 20 to load 14, the ripple energy from the output pulse, which is in excess of the load voltage level, is shunted into $C_1$ causing the voltage across $C_1$ to increase. The increase in voltage developed across $C_1$ is detected in the voltage divider network of resistors 26 and 28 causing the sense input to amplifier 40 to increase in signal level. When the reference input of amplifier 40 is greater than the sense input the output of amplifier 40 is negative maintaining $Q_1$ and $Q_2$ cutoff. When the sense input to amplifier 40 exceeds the reference voltage the output of the high gain amplifier goes positive providing an enabling voltage output for the base of $Q_1$. However, this output is shunted through $Q_2$ and $Q_1$ cannot be enabled until the end of the high voltage pulse coupled to load 14; at which time, the inhibit input to the base of $Q_2$ is removed allowing $Q_2$ to turn off and $Q_1$ to turn on. When $Q_1$ is turned on a constant potential source $V_{cc}$ supplys current through the primary winding of transformer 50, $Q_1$, and resistor 44 to ground. This provides a constant current pulse at the secondary of transformer 50 of sufficient voltage magnitude to activate the high voltage zener diode 52. The zener current need only be of sufficient magnitude to insure that all the ripple energy has been removed from $C_1$ by the start of the next pulse. When the voltage across $C_1$ has been restored to its original potential level the voltage developed across resistors 26 and 28 is reduced thereby reducing the sense voltage input to amplifier 40 to its original potential, and the output of amplifier 40 will switch negative turning off $Q_1$. The circuit is then ready for the next input pulse.

Figure 2:
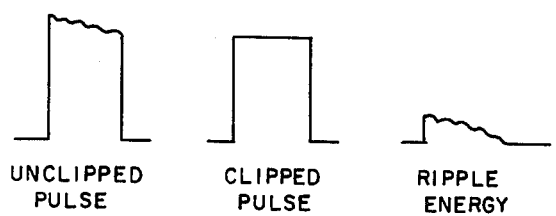
FIG. 2 is a typical pulse waveform diagram of pulses in the circuit.

FIG. 2 discloses the typical high voltage pulse signal applied to regulator 10. Before the unclipped pulse is acted upon by the regulator a ripple voltage across the top of the pulse is present. As the signal is passed through the regulator the ripple voltage bleeds into capacitor $C_1$ providing a substantial square pulse to the load circuit 14.

This allows capacitor $C_1$ to be physically small since it is a lower voltage operating capacitor than one which will have a voltage increase of 30 percent, for example, across a series or burst of pulses, and it is a lower capacitance than one which must hold down the voltage rise across the burst. Therefore, it is physically smaller while accurately regulating the pulse supply to the load.

When the burst of pulses coupled through the regulator terminates, there is a gradual bleeding of the capacitance voltage through the resistance network 26 and 28 unless the regulated power supply 30 is activated to restore the charge across the capacitor $C_1$. Where the inhibit pulse to power supply 30 is a manually operated switch, the switch may be activated prior to the next burst of power pulses and terminated just prior to the burst. For the example where an auxiliary winding supplys pulses to a monostable multivibrator to control the inhibit input, when the pulse repetition frequency of the burst of pulses is exceeded, after termination of the burst, the predetermined delay time of the monostable multivibrator is allowed to continue without being interrupted by a retriggered input. The monostable multivibrator will flip removing the inhibit input and activating the regulated power supply to restore the charging current to the capacitor. As soon as another pulse burst is coupled into the regulator, the simultaneously activated trigger pulse coupled to the multivibrator again inhibits the regulated power supply.

Although a particular embodiment and form of this invention has been illustrated, it is apparent that various modifications and embodiments of the invention may be made by those skilled in the art without departing from the scope and spirit of the foregoing disclosure. Accordingly the scope of the invention should be limited only by the claims appended hereto.

I claim:

1. A pulse voltage regulator comprising: a transformer having a primary winding disposed to receive pulses of high voltage energy and a secondary winding disposed for providing output load pulses in response to input pulses; in series, a diode and a capacitance coupled across said transformer secondary, the anode of said diode being coupled to one side of said transformer; a resistance network coupled across said capacitance; a zener diode and switching means coupled in series across said capacitance for selectively discharging said capacitance to a predetermined level.

2. A pulse voltage regulator as set forth in claim 1 wherein said switching means comprises a first transistor and a second transformer; the primary of said second transformer being disposed for coupling a constant potential therethrough to the collector of said transistor, and the secondary of said second transformer being coupled in series with said zener diode across said capacitance; the emitter of said transistor being coupled to the common side of said capacitance and the secondary of said second transformer, and the base of said transistor being coupled to said resistance network for receiving a variable voltage signal in response to voltage changes across said resistance network.

3. A pulse voltage regulator as set forth in claim 2 and further comprising an amplifier having first and second inputs and an output, the output of said amplifier being coupled to the base of said first transistor and the first input of said amplifier being coupled to said resistance network to provide said variable voltage signal, said second input of said amplifier being disposed to receive a reference input signal.

4. A pulse voltage regulator as set forth in claim 3 wherein said switching circuit further comprises a second transistor having the collector coupled to the base of said first transistor and the emitter coupled in parallel with the emitter of said first transistor, the base of said second transistor being disposed for receiving an input signal to inhibit operation of said first transistor.

5. A pulse voltage regulator as set forth in claim 4 and further comprising a regulated power supply and a second diode coupled in series across said capacitance, the cathode of said second diode being coupled to the cathode of said first diode in series with said capacitance.

6. A pulse voltage regulator as set forth in claim 5 wherein said regulated power supply has an input for receiving an inhibit signal for controlling the output voltage to said capacitance.

* * * * *